United States Patent

Krafcik et al.

Patent Number: 6,069,444
Date of Patent: *May 30, 2000

[54] ELECTROLUMINESCENT LAMP DEVICES AND THEIR MANUFACTURE

[75] Inventors: Robert J. Krafcik, Phoenix; Douglas T. Wheeler, Tempe; Walter J. Paciorek; Ralph McGuigan, both of Phoenix; Rodney T. Eckersley, Tempe, all of Ariz.; Dee Lynn Johnson; Harold T. Munson, both of Woodbury, Minn.

[73] Assignee: Durel Corporation, Chandler, Ariz.

[*] Notice: This patent is subject to a terminal disclaimer.

[21] Appl. No.: 09/028,622

[22] Filed: Feb. 24, 1998

Related U.S. Application Data

[63] Continuation-in-part of application No. 08/731,519, Oct. 15, 1996, which is a continuation of application No. 08/407,269, Mar. 20, 1995, Pat. No. 5,565,733, and a continuation of application No. 07/991,295, Dec. 16, 1992.

[51] Int. Cl.$^7$ ........................................................ H01J 1/62
[52] U.S. Cl. .......................... 313/510; 313/511; 313/512; 313/506
[58] Field of Search ..................................... 313/506, 510, 313/511, 512

[56] References Cited

U.S. PATENT DOCUMENTS

| | | |
|---|---|---|
| 2,644,113 | 6/1953 | Etzkorn . |
| 2,791,050 | 5/1957 | Neugass . |
| 2,872,567 | 2/1959 | Strange . |
| 3,015,718 | 1/1962 | Petri . |
| 3,037,137 | 5/1962 | Motson . |
| 3,161,797 | 12/1964 | Butler et al. . |
| 3,161,947 | 12/1964 | Blockson . |
| 3,286,115 | 11/1966 | Ranby et al. . |
| 3,670,067 | 6/1972 | Coolbaugh et al. . |
| 3,994,225 | 11/1976 | Sitzberger . |
| 4,471,350 | 9/1984 | Chow . |
| 4,687,968 | 8/1987 | Frayer . |
| 4,774,434 | 9/1988 | Bennion . |
| 4,816,717 | 3/1989 | Harper et al. . |
| 4,839,558 | 6/1989 | Mierzwinski . |
| 4,853,594 | 8/1989 | Thomas . |
| 4,904,901 | 2/1990 | Simopoulos et al. . |
| 4,936,511 | 6/1990 | Johnson et al. . |
| 5,184,969 | 2/1993 | Sharpless et al. ........................ 313/506 |
| 5,264,061 | 11/1993 | Juskey et al. . |
| 5,309,060 | 5/1994 | Sharpless et al. ........................ 313/512 |
| 5,811,930 | 9/1998 | Krafcik et al. ........................... 313/510 |

FOREIGN PATENT DOCUMENTS

| | | |
|---|---|---|
| 2320142 | 4/1973 | Germany . |
| 2-275492 | 11/1990 | Japan . |

*Primary Examiner*—Vip Patel
*Assistant Examiner*—Todd Reed Hopper
*Attorney, Agent, or Firm*—Fish & Richardson P.C.

[57] ABSTRACT

An electroluminescent lamp assembly includes electroluminescent lamps of selected limited size placed and secured upon a larger printed circuit substrate employing surface mount techniques. The electroluminescent lamp assembly includes a substrate having a relatively large lamp receiving surface and relatively smaller lamps. At least one of these smaller lamps is a multi-layer sheet-form electroluminescent lamp having a sheet-form layer containing electroluminescent particles, the layer disposed between a pair of sheet-form conductive layers, one of which is transparent for transmitting light emitted from the particles. The electroluminescent lamps each have conductors exposed for engagement and connection with conductive traces on the lamp receiving surface of the substrate in a surface mounted face-to-face arrangement and are distributed in spaced-apart relationship according to a preselected illumination pattern and connected to the conductive traces.

31 Claims, 16 Drawing Sheets

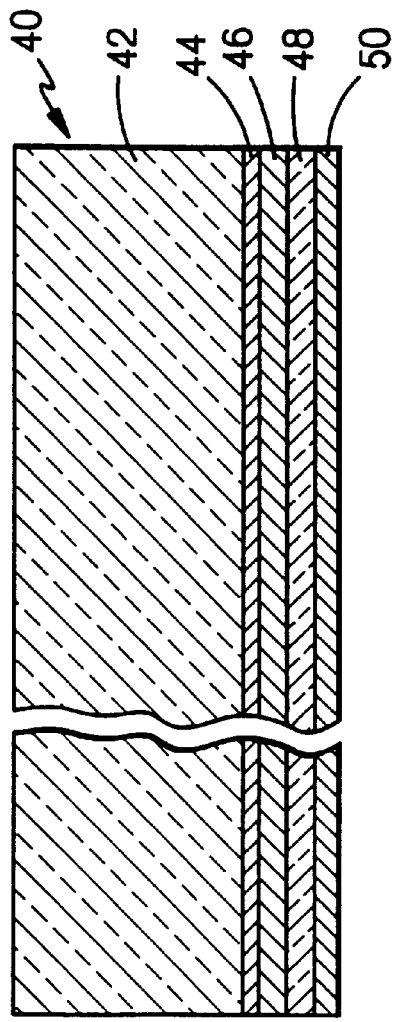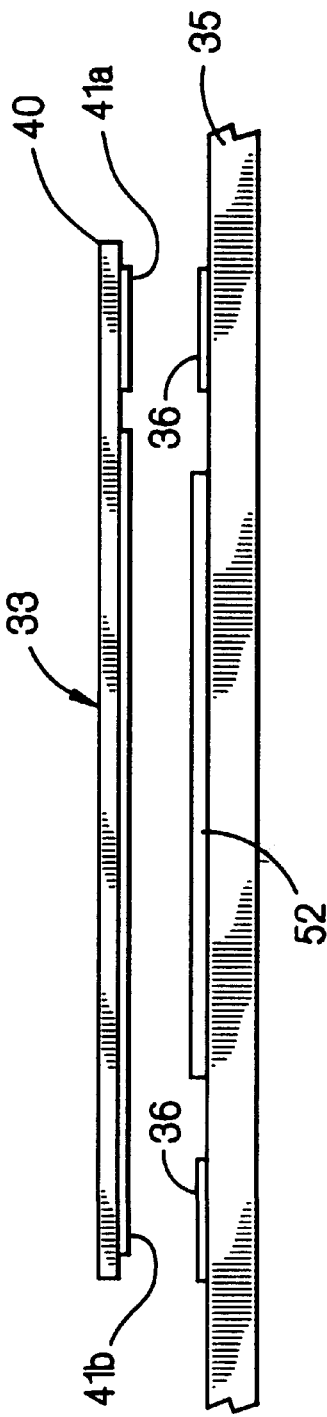

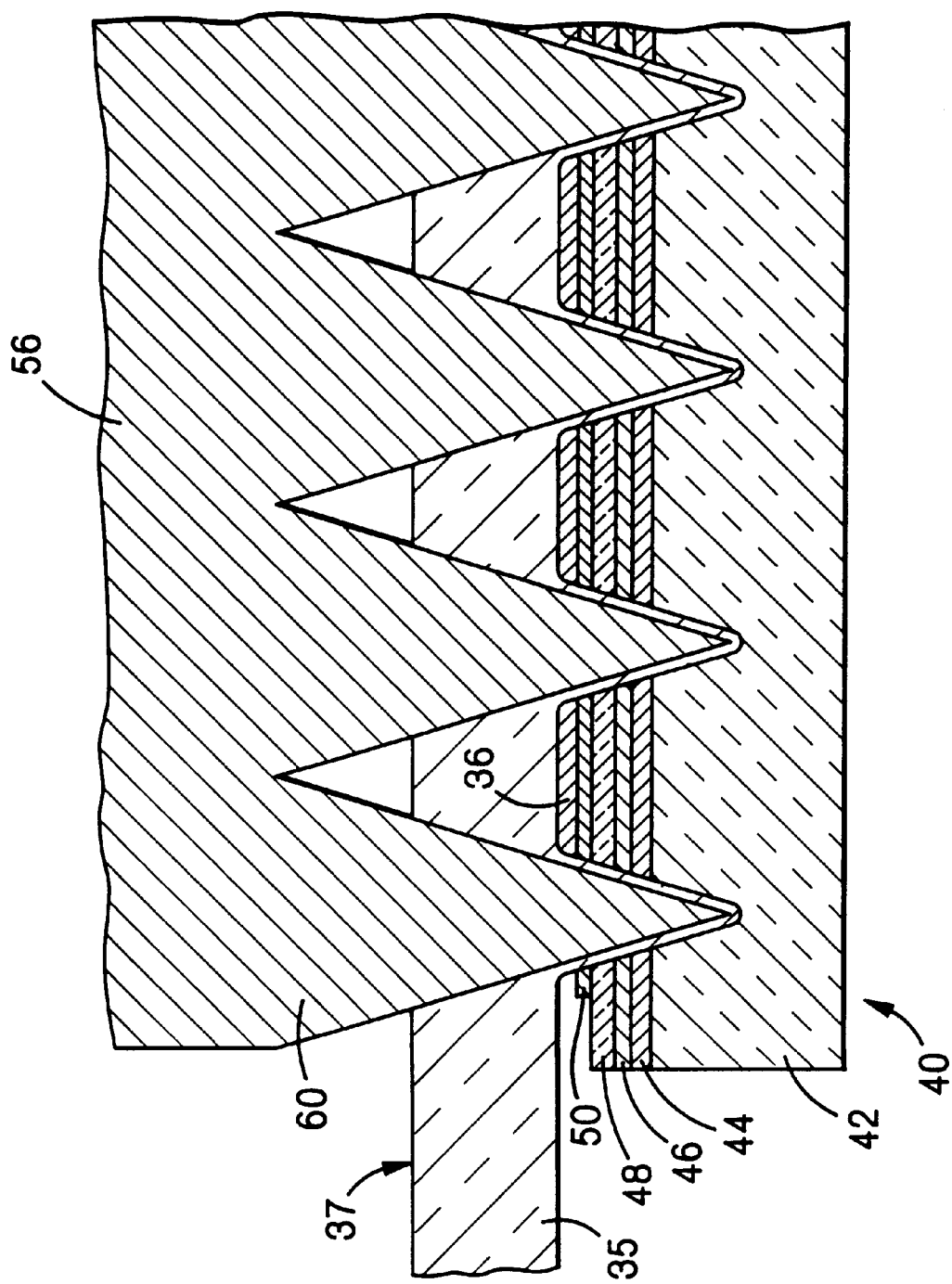

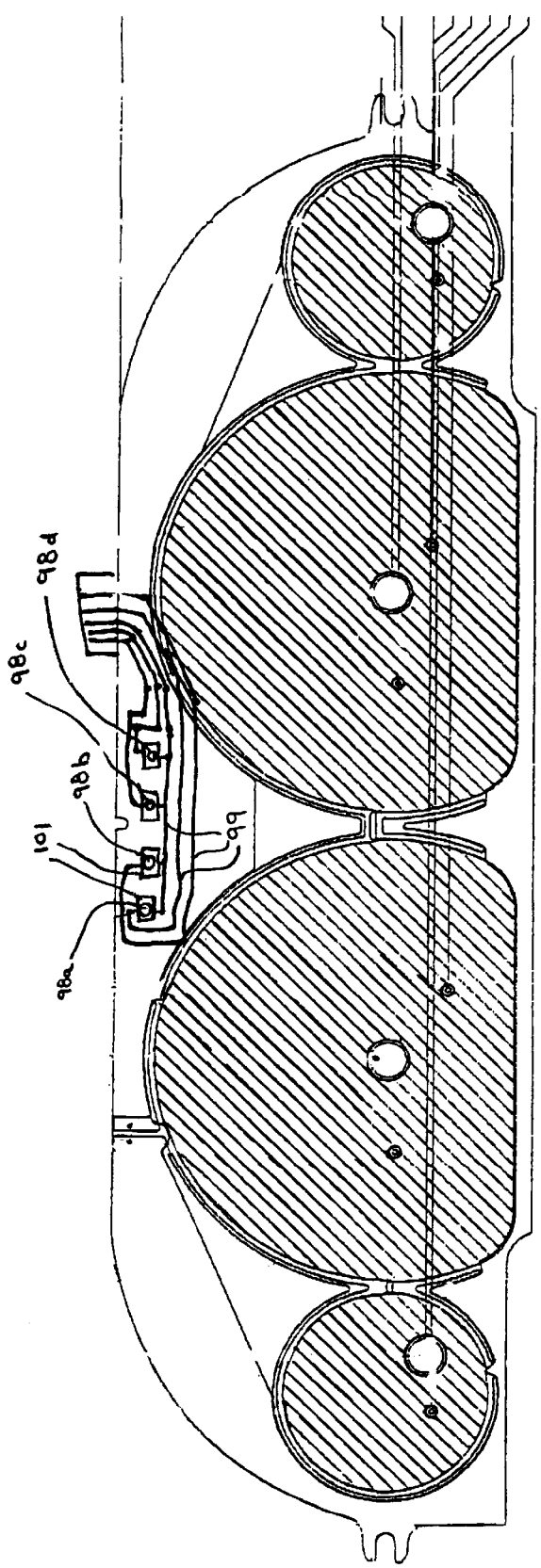
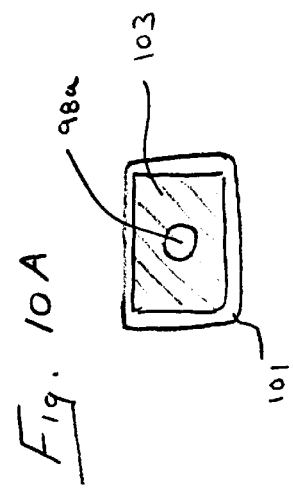
Fig. 10
Fig. 10A

ELECTROLUMINESCENT LAMP DEVICES AND THEIR MANUFACTURE

CROSS REFERENCE TO RELATED APPLICATIONS

This application is a continuation-in-part of application Ser. No. 08/731,519 filed Oct. 15, 1996, which is a continuation of application Ser. No. 08/407,269 filed Mar. 20, 1995 which issued as U.S. Pat. No. 5,565,733 and is a continuation of application Ser. No. 07/991,295 filed Dec. 16, 1992.

BACKGROUND OF THE INVENTION

This invention relates to the achievement of low cost and versatile electroluminescent lamp products.

As is known by those in the art, an electroluminescent lamp is a surface-area light source consisting of a suitable phosphor placed between electrodes, one of which is essentially transparent. When an alternating current is applied between the electrodes the phosphor emits light, the color of the light is dependent on the choice of phosphor.

Such lamps are suitable for a wide variety of applications, including illuminated instrument panels, dial indicators, signs and the like. Such electroluminescent lamp panels can be fabricated by applying a general coating of conductive material, such as indium tin oxide, over the entire substrate panel, the coating providing the material for one of the electrodes, upon which the phosphor and rear electrode layers are applied. In many applications, the full surface of the panel is not required to be light-emitting and the unlit portion is masked by printing an opaque ink on the front surface of the lamp. Alternatively, as described in U.S. Pat. No. 4,904,901, material (indium tin oxide) corresponding to the transparent layer is deposited over an entire surface of the panel and is thereafter removed from most of the surface with an acid etch leaving behind areas corresponding to discrete areas of illumination. The phosphor and rear electrode layers are then deposited over the discrete areas. Likewise, either the phosphor or the rear electrode can be applied over desired areas using techniques well-known in the art.

SUMMARY OF THE INVENTION

The invention features a lamp assembly including electroluminescent lamps of selected limited size placed and secured upon a larger printed circuit substrate employing surface mount techniques.

In a general aspect of the invention, the electroluminescent lamp assembly includes a substrate having a relatively large lamp receiving surface and relatively smaller lamps, at least one of the lamps including a mechanically flexible, multi-layer sheet-form electroluminescent lamp having a sheet-form layer containing electroluminescent particles, the layer disposed between a pair of sheet-form conductive layers (i.e., continuous, uniformly thin layers), one of which is transparent for transmitting light emitted from the particles. The electroluminescent lamps each have conductors exposed for engagement and connection with conductive traces on the lamp receiving surface of the substrate in a surface mounted face-to-face arrangement and are distributed in spaced-apart relationship according to a preselected illumination pattern and connected to the conductive traces. The face-to-face engagement may involve either the front face or the back face of the electroluminescent components, depending upon the particular construction employed.

Because the area occupied by the lamp is restricted solely to the area desired to be illuminated, the area covered by the lamp is significantly reduced. As is known in the art, conductive materials (e.g. indium tin oxide) used to provide an electrode of the lamp can be relatively expensive. In the present invention, opaque patterns for covering lit line traces between desired areas of illumination are not required, or one of limited dimension.

Embodiments of this aspect of the invention may include one or more of the following features. In one embodiment, the sheet-form lamp includes a carrier substrate such as a biaxially oriented sheet (e.g., a very thin film) formed of a polyester or a polycarbonate material and the thermoplastic layers are comprised of polyvinylidene fluoride.

A first one of the electroluminescent lamps has a light emitting characteristic (e.g. color or intensity) that is different from a light emitting characteristic of a second one of the electroluminescent lamps. Smaller segmented and individually addressable lamps consume less electrical power, generate less heat and are more reliable than large full area lamps having opaque patterns over unlit portions of the lamp.

The relatively smaller lamps may include a rigid lamp which may be in the form of a multi-layer sheet-form electroluminescent lamp of smaller area than the flexible multi-layer sheet-form electroluminescent lamp. The rigid lamp is surface mounted face-to-face to the substrate. The rigid lamp may also be surface mounted face-to-face to the flexible multi-layer sheet-form electroluminescent lamp.

The substrate further includes a second lamp-receiving surface having conductive traces and one of the relatively smaller lamps is electrically-connected to these conductive traces. The substrate has a transparent portion through which light from the relatively smaller lamps passes to the first-mentioned lamp-receiving surface. A light-absorbing filter can be disposed over the transparent portion. The substrate may be a flexible substrate.

Automation of the process for placing and securing individual lamps is preferably achieved by programmed pick and place robots for selecting and placing the lamp on the surface of a receiving printed circuit substrate according to pre-specified instructions, followed by automated steps to connect and secure the lamps to the substrate.

The electroluminescent lamp assembly includes securing structure to attach the multi-layer sheet-form electroluminescent lamp to the lamp receiving surface of the substrate. In one embodiment, the securing structure includes portions of the substrate that are mechanically deformed. In another embodiment, the securing structure is a thermal bond, such as an ultrasonic weld. The securing structure can also be a mechanical fastener or a localized deposit of adhesive at a region of engagement between conductors of the multi-layer sheet-form electroluminescent lamp and selected ones of the conductive traces on the lamp receiving surface of the substrate.

In general, the achievement of a single overall lamp module that is practical and inexpensive to manufacture, and which selectively emits various qualities of light at freely selectable locations is a particularly important practical achievement of the present invention.

The invention also permits a number of lamps to be provided onto a printed circuit substrate, each lamp or separate groups of lamps being independently addressable. Individually addressable lamps of the unit may be individually driven or may be powered by a single power supply.

Other advantages and features of the invention will become apparent from the following description and from the claims.

DRAWINGS

FIG. 2 is a cross sectional side view taken along lines 2—2 of FIG. 1.

FIGS. 3A–3D are cross sectional side views of a surface mounted lamp being secured to a substrate.

FIG. 10 is a plan view of another embodiment of a lamp assembly having electroluminescent lamps.

FIG. 10A is an enlarged view of one of the rigid lamps of FIG. 10.

DETAILED DESCRIPTION

Figure 1:
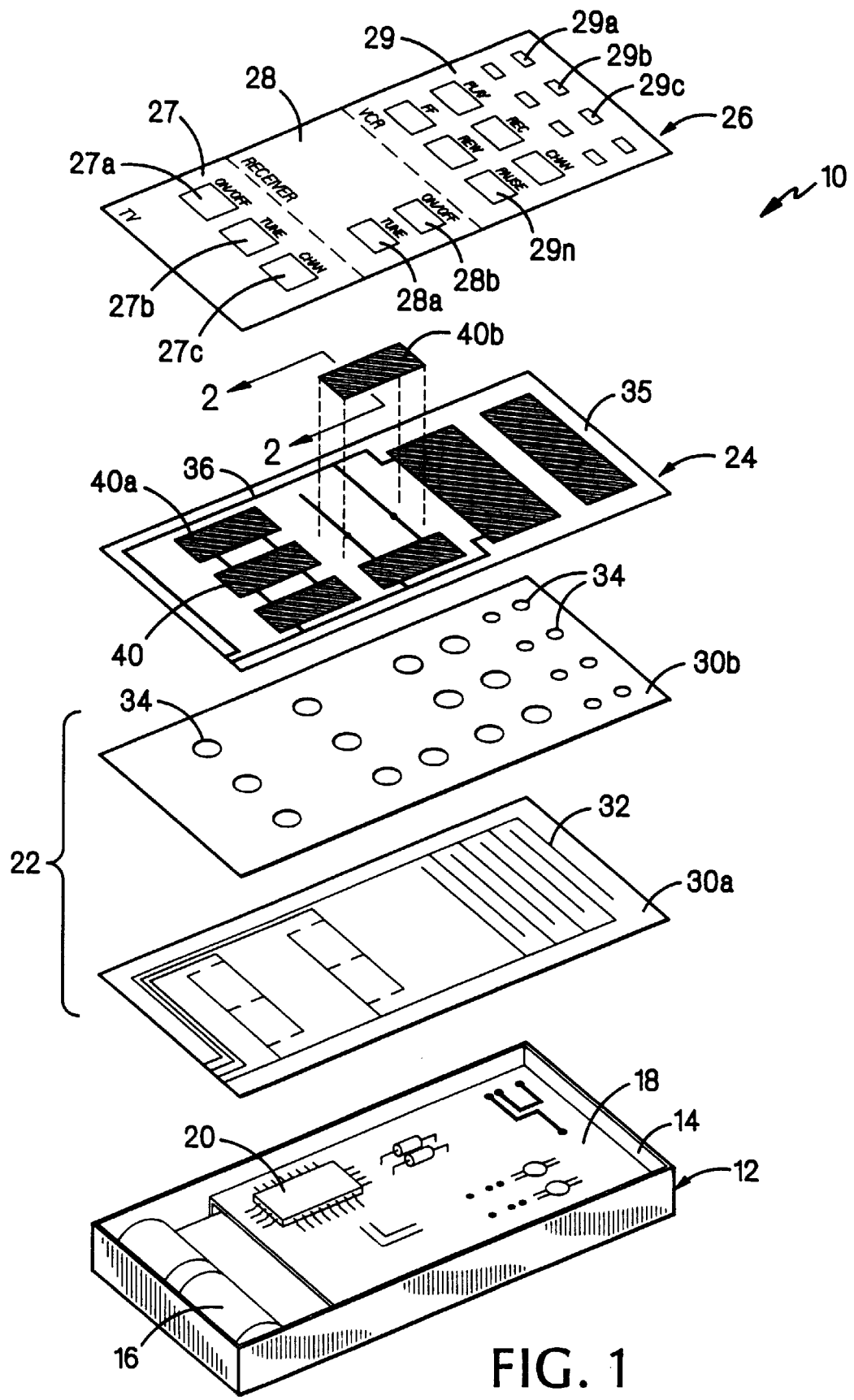
FIG. 1 is an exploded view of a hand-held remote control unit having surface mounted electroluminescent lamps according to the invention.

Referring to FIG. 1, a hand-held remote control device 10 for controlling a number of audio/visual instruments (e.g. television, VCR, stereo receiver) includes a housing 12 having a cavity 14 supporting a battery 16 and a control board 18. Control board 18 includes components 20 used to distribute power and signals for generating an infrared control signal to be received by the instruments. In addition, a switch keypad 22, a modular lamp circuit 24, and a graphics panel 26 are disposed within cavity 14 in vertical succession. Graphics panel 26 includes a graphic having areas 27, 28, 29 associated with each controlled component. Each area 27, 28, 29 further has regions 27a–27n, 28a–28n, 29a, 29n designating particular functions (e.g. on/off, volume, channel select) associated with the component designated for that area. A bezel (not shown) may be used to secure the graphics panel 26 to housing 12. With this arrangement, remote control unit 10 has an illuminated tactile membrane keypad operated by depressing regions associated with a selected audio/visual instrument.

Switch keypad 22 includes a flexible polyester board 30a having conductive traces 32 connected to control board 18 with a switch board 30b disposed thereon. Switch board 30b includes shorting switches 34, each switch corresponding to a particular function of a particular component and positioned over a region of circuit board 30a such that application of a downward force on the switch effectively "shorts" traces 32 corresponding to a particular function.

Modular lamp unit 24 produced using techniques of the present invention is disposed between switch keypad 22 and graphics panel 26 and includes a flexible printed circuit substrate 35 having conductive traces 36 of conductive ink upon which a number of flexible electroluminescent lamps 40 have been placed. Each electroluminescent lamp 40 has a pair of conductive pads 41a (FIG. 4A) formed by conductive ink deposits on the plastic substrate. These conductive pads provide electrical connection points to conductive traces 36 leading to power and ground buses. Portions of conductive traces 36 that are not connection points to conductive pads 41a of lamps 40, are generally covered with a dielectric layer to provide electrical isolation, reduce silver migration, and to provide moisture protection. One method of providing such a dielectric layer is to screen print a UV curable ink, for example, Product No. 5014, manufactured by E.I. DuPont de Nemours & Co., Wilmington, Del., over portions of conductive traces 36 on flexible substrate 35. Flexible substrate 35 is made from a polyester based material, model no. ST505, a product of ICI Corp., Wilmington, Del. having a thickness of about 0.007 inches and a surface with a coating of indium tin oxide subsequently applied.

Referring to FIG. 2, an exemplary electroluminescent lamp 40 is shown. It is limited in size to a specific area to be illuminated and comprises a number of layers beginning with a transparent substrate 42, (e.g., a sheet of polyester film approximately 0.007 inches thick). Substrate 42 has on one side a pre-applied coating of a transparent conductive material, preferably, indium tin oxide (ITO), although aluminum oxide, gold and silver or other composite coatings may also be used. The ITO material is preferably vacuum sputtered onto the substrate panel to form a transparent front coating 44 that is approximately 1000 Å thick. Transparent front coating 44 is covered with a phosphor layer 46 formed of electroluminescent phosphor particles, e.g., zinc sulfide doped with copper or manganese which are dispersed in a polymeric binder. Phosphor layer 46 is applied to the front transparent coating 44 by screen printing and has a thickness of approximately 0.001 inches. A dielectric layer 48, approximately 0.001 inches thick, is formed of a high dielectric constant material, such as barium titanate dispersed in a polymeric binder. Dielectric layer 48 is screen printed over phosphor layer 46 so that it extends to the edges of the lamp 40. Deposited over the dielectric layer 48 is a rear electrode 50 formed of conductive particles, e.g., silver, or carbon, dispersed in a polymeric binder to form a screen printable ink. The ink is screen printed onto dielectric layer 48 to form rear electrode 50 in a layer approximately 0.0005 inches thick. In some applications of lamp 40, an additional insulating layer (not shown) may be applied over rear electrode 50 to prevent possible shock hazard or to provide a moisture barrier to protect the lamp. A suitable polymeric binder for these layers is PVDF as described in U.S. Pat. No. 4,816,717, incorporated herein by reference.

Referring again to FIG. 1, each of the pre-formed electroluminescent lamps 40 is positioned between particular shorting switches 34 of switch keypad 22 and corresponding areas 27, 28, 29 of graphics panel 26. The flexible nature of lamps 40 permits the downward force applied to cover plate 26 to be transferred to shorting switches 34 without damaging lamps 40. In this embodiment, electroluminescent lamps 40 associated with particular regions of graphics panel 26 have different selected colors. For example, area 27 associated with television functions is illuminated with an electroluminescent lamp 40a emitting orange light while area 29 associated with controlling a video cassette recorder (VCR) is illuminated with lamp 40b emitting blue light.

Referring to FIGS. 3A–3D, a process for bonding the small pre-formed electroluminescent lamps 40 to the flexible substrate 35 of the modular unit is shown.

As shown in FIG. 3A, lamp 40 with lit side 33 facing up is positioned on flexible substrate 35 such that conductive pads 41a, 41b of the lamp are superposed over traces 36 of the substrate. A small drop of adhesive or as shown here, a double-sided pressure sensitive adhesive strip 52 is placed between flexible substrate 35 and rear electrode 50 of lamp 40 at a region between conductive pads 41a, 41b to lightly fasten lamp 40 to flexible substrate 35. Referring back to FIG. 2, conductive pad 41b is directly connected to rear electrode 50 while conductive pad 41a is connected to transparent front coating 44 through a via hole (not shown). Adhesive strip 52 permits the lamp 40 and flexible substrate 35 combination to be flipped over during the course of manufacture such that lamps 40 are beneath the board for reasons as explained below.

Figure 3B:
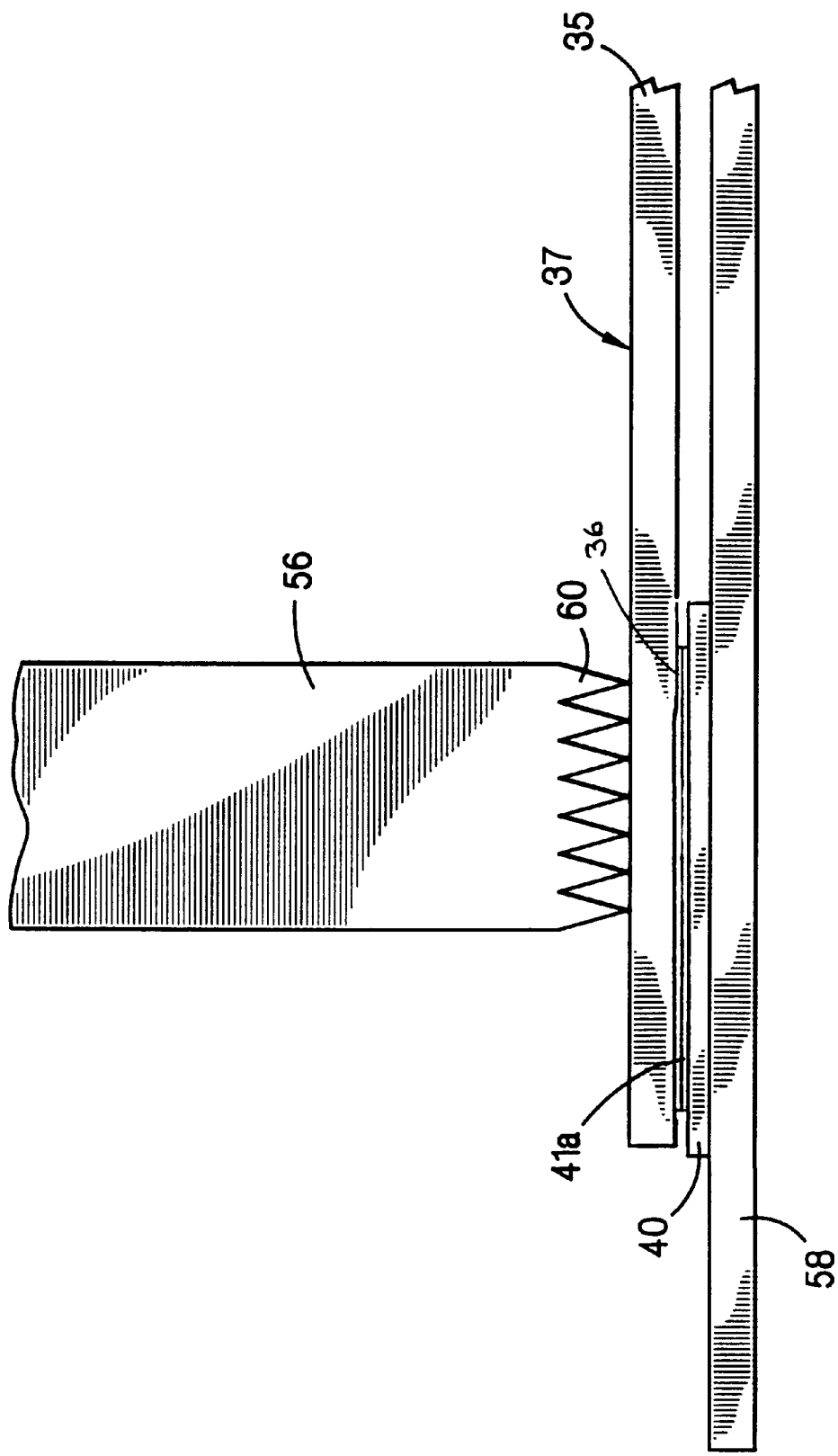

Referring to FIG. 3B, lamp 40 is electrically and mechanically bonded to flexible substrate 35 using an ultrasonic welder 54 (FIG. 5), such as Model 901AE IW Integrated Welder, manufactured by Branson Ultrasonics Corp., Danbury, Conn. As described above in conjunction with FIG. 3A, the lamp 40 and flexible substrate 35 combination may be flipped over and provided to welder 54 so that an under surface 37 of flexible substrate 35 faces a knurled welding tool 56 positioned above the region of conductive pad 41a of lamp 40. Knurled welding tool 56 has a diameter of about 0.25 inches and a tip having a grid array of relatively sharp prongs 60 approximately 0.020 inches long and spaced from each other by 0.030 inches. With this arrangement, transparent coating 44 of lamp 40 is face down on an X-Y base plate 58 of welder 54. Welder 54 is electronically programmed to position welding tip 56 over a plane parallel with base plate 58.

As shown in FIG. 3C, welder 54 is programmed to lower knurled welding tool 56 to undersurface 37 with a predetermined force and for a precise duration of time so that prongs 60 penetrate through flexible substrate 35 and into lamp 40. Prongs 60 extend through rear electrode 50, phosphor 46 and into transparent substrate 42 of lamp 40. As is known by those in the art, vibration welding is a technique for producing strong structural or high-pressure seals between thermoplastic materials. High frequency electrical energy (20 kilohertz) is provided by a solid state power supply to a converter unit (not shown) of welder 54. The converter unit changes the electrical energy into mechanical vibratory energy at ultrasonic frequencies. The vibratory energy is transmitted to the joint area through welding tool 56 and is converted to heat at the prongs of the tool through friction. In this embodiment, the undersurface 37 of flexible substrate 35 is vibrated against the rear electrode 50 of lamp 40 under a pressure of 10–20 lbs/in$^2$, for 25–75 milliseconds. Frictional heat generated at the interface area causes the polyester material of flexible substrate 35 and transparent substrate 42 to fuse such that a strong molecular bond is provided therebetween.

Figure 3D:
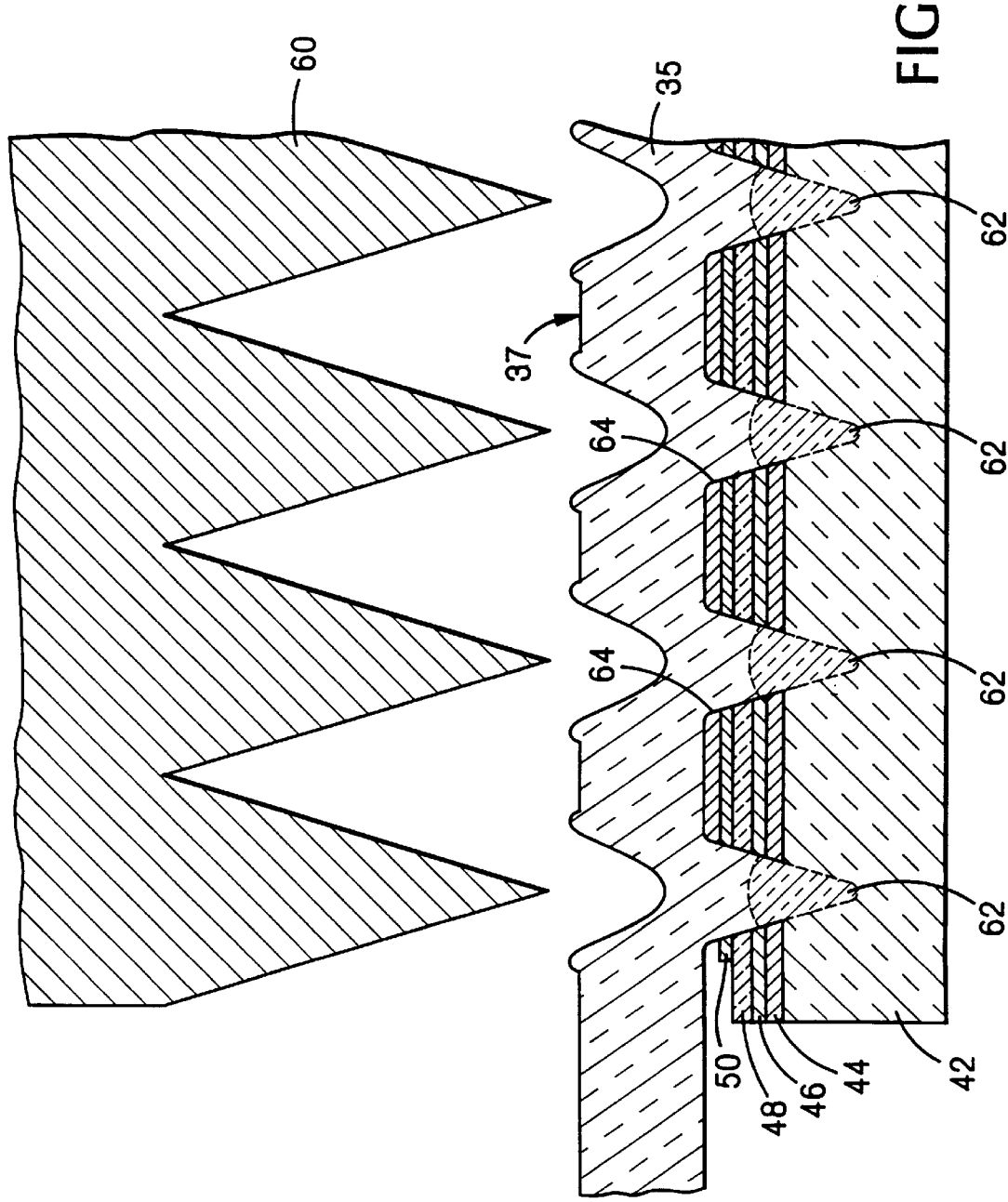

Referring to FIG. 3D, to complete the weld operation, knurled welding tool 56 is lifted away from flexible substrate 35 leaving behind mechanical contact points 62 of fused polyester of flexible substrate 35 and transparent substrate 42 of lamp 40. The weld strength of mechanical contact points 62 approaches that of the parent material. Concurrently, the localized heat and vibration provided by the knurled welding tool 56 forces the screen printable conductive polymeric ink of rear electrode 50 away from the penetration locations to form electrical contact paths 64 between mechanical contact points 62, so that electrical continuity is assured.

Figure 4A:
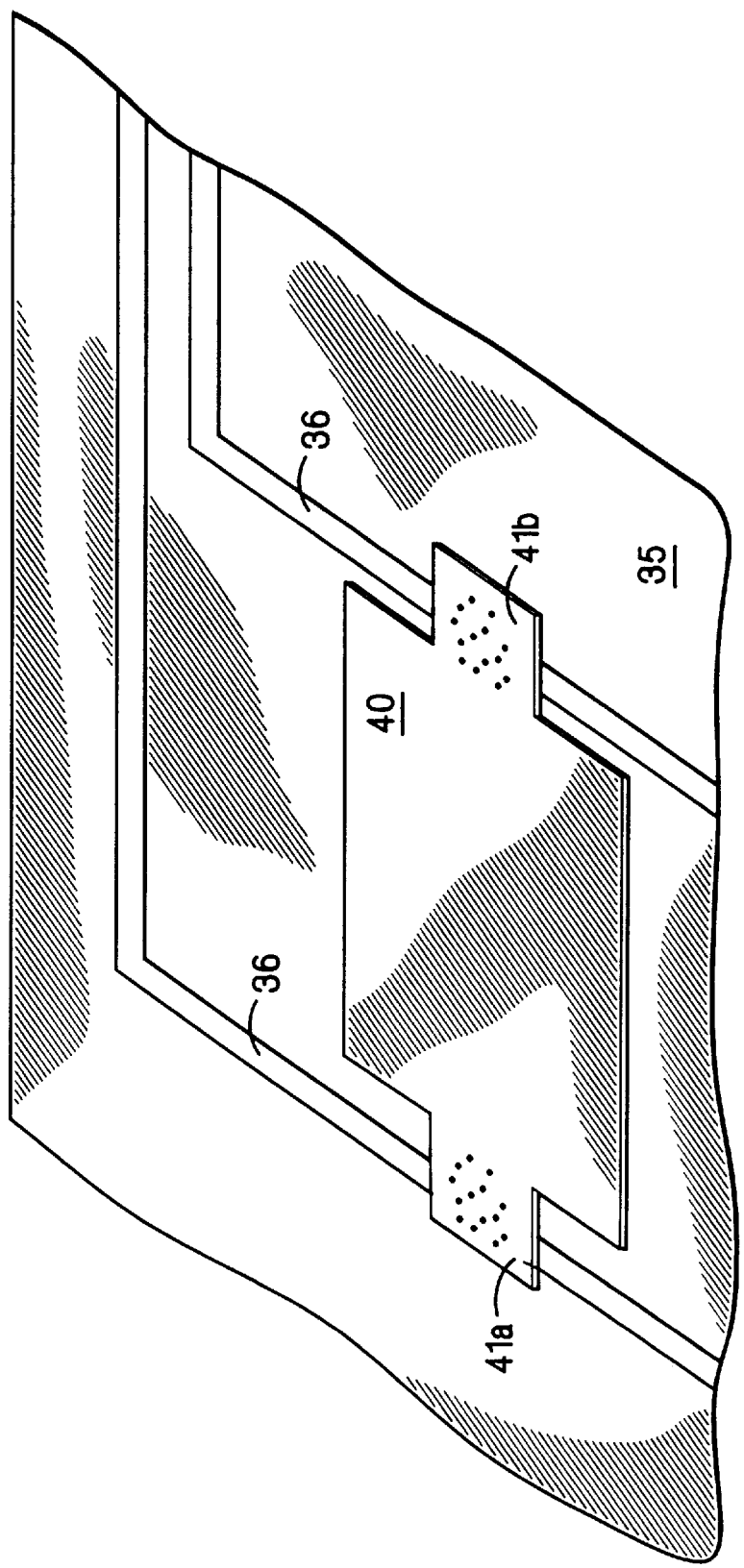
FIGS. 4A–4B are top views of surface mounted lamps bonded to a substrate.
Figure 4B:
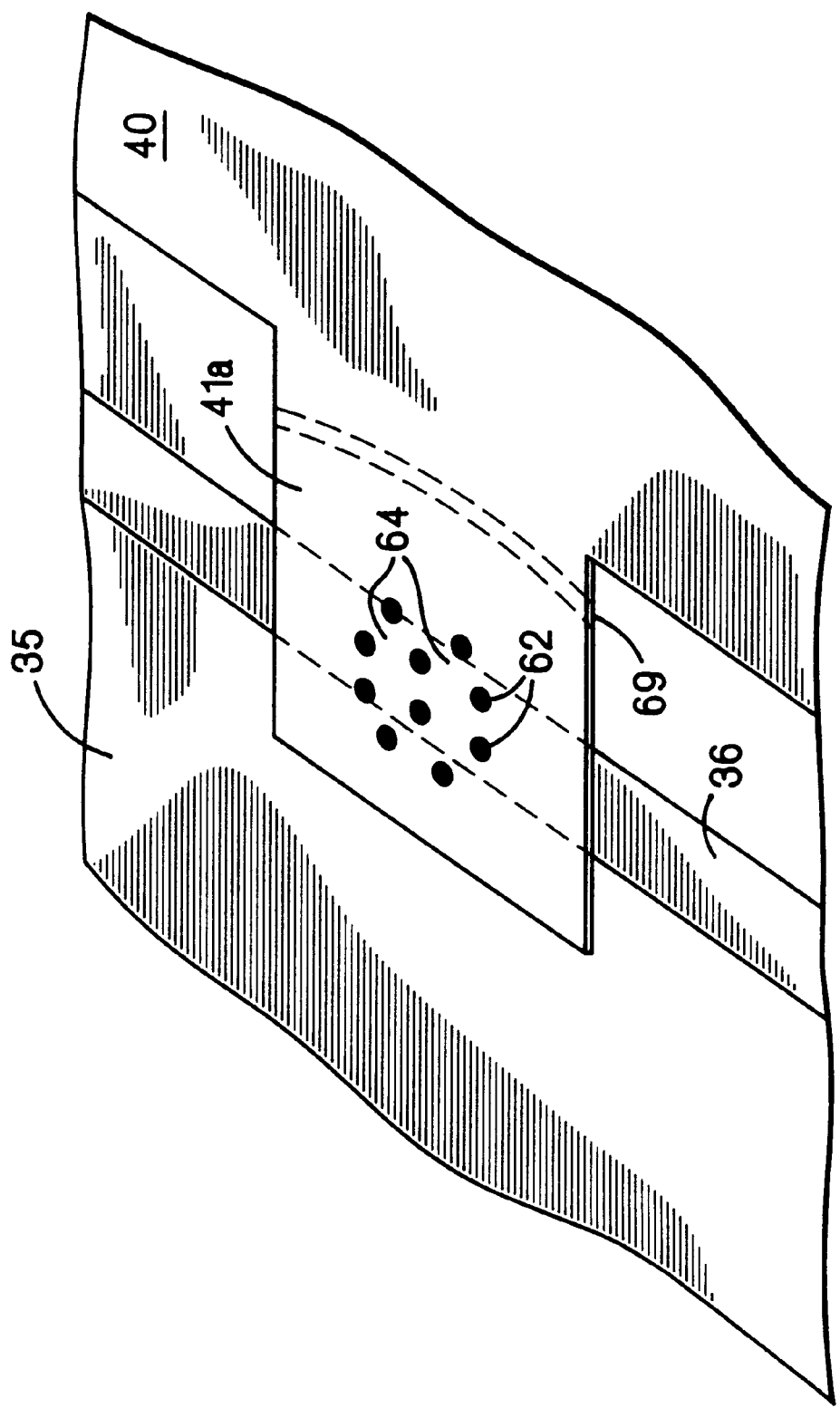

Referring to FIGS. 4A and 4B, lamp 40 is shown having a pair of conductive pads 41a attached to conductive traces 36 of flexible circuit 35. The grid arrangement of prongs 60 of welding tool 56 is used to provide the grid of fused mechanical contact points 62 and conductive ink to conductive ink electrical contact paths 64 between printed rear electrode 40 and printed conductive traces 36. A line of interruption 69 is laser scribed through rear electrode 50 to provide electrical isolation between the rear electrode 50 and front electrode 44. Electrical isolation is provided because connection of rear electrode 50 to flexible substrate 35 as described in FIGS. 3A–3D (or when using methods described below) can cause front electrode 44 to short with rear electrode 50.

Figure 5:
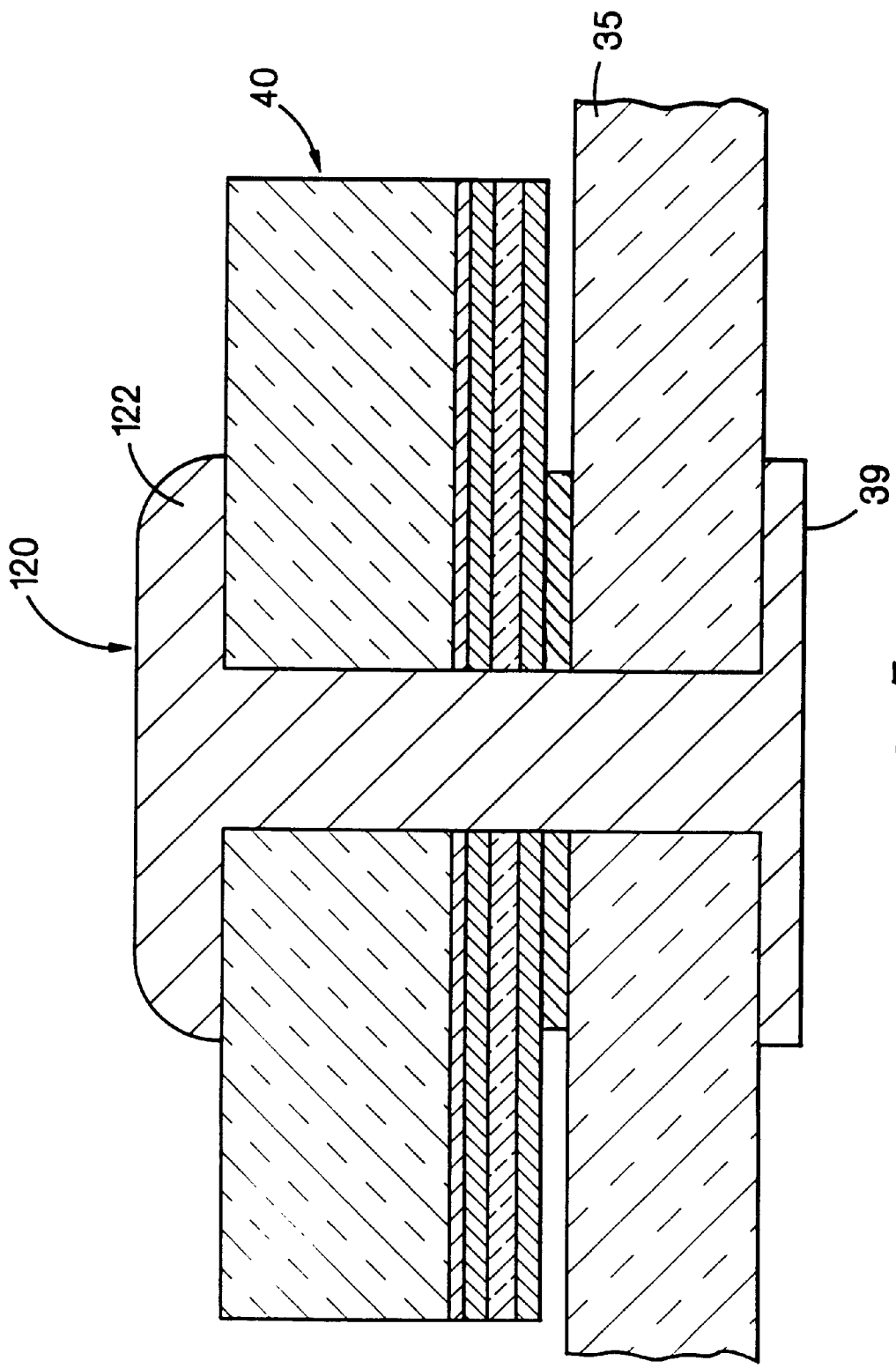
FIG. 5 is a cross-sectional view of a surface mounted lamp attached to a flexible substrate using a mechanical eyelet.
Figure 6:
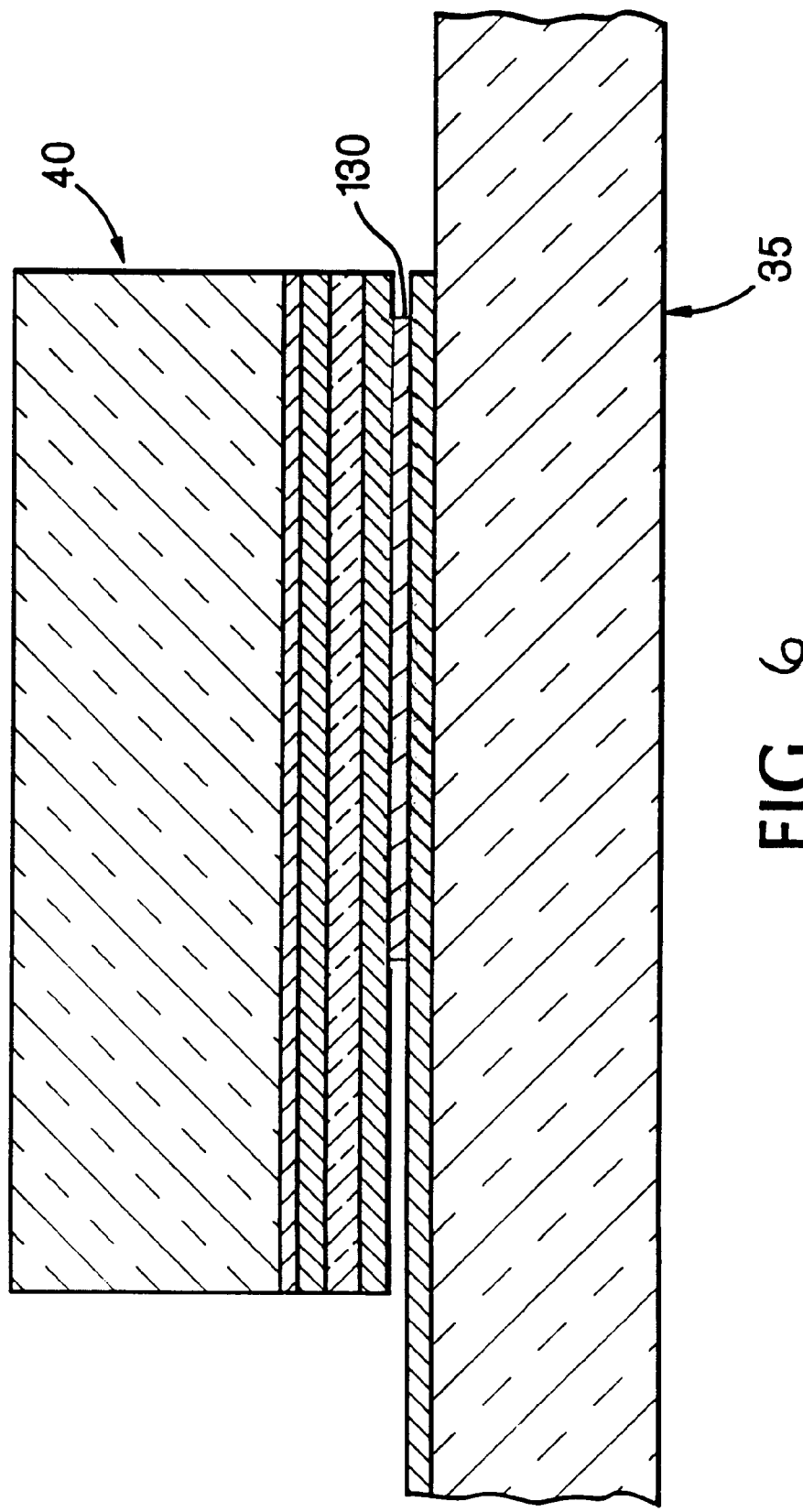
FIG. 6 is a cross-sectional view of a surface mounted lamp attached to a flexible substrate using an adhesive strip.

It is appreciated that the small, pre-formed lamps 40 may be connected to flexible substrate 35 using other attachment means. Referring to FIG. 5, for example, a mechanical eyelet 120 is shown having a headed pin portion 122 that is disposed through lamp 40 and flexible substrate 35 and flattened at a bottom surface 39 of substrate 35 to fasten lamp 40 firmly to the substrate. Alternatively, as shown in FIG. 6, a strip of strong conductive adhesive film 130, such as Model No. 9703, a product of 3M Corporation, St. Paul, Minn. is used to securely fix lamp 40 and substrate 35.

Figure 7:
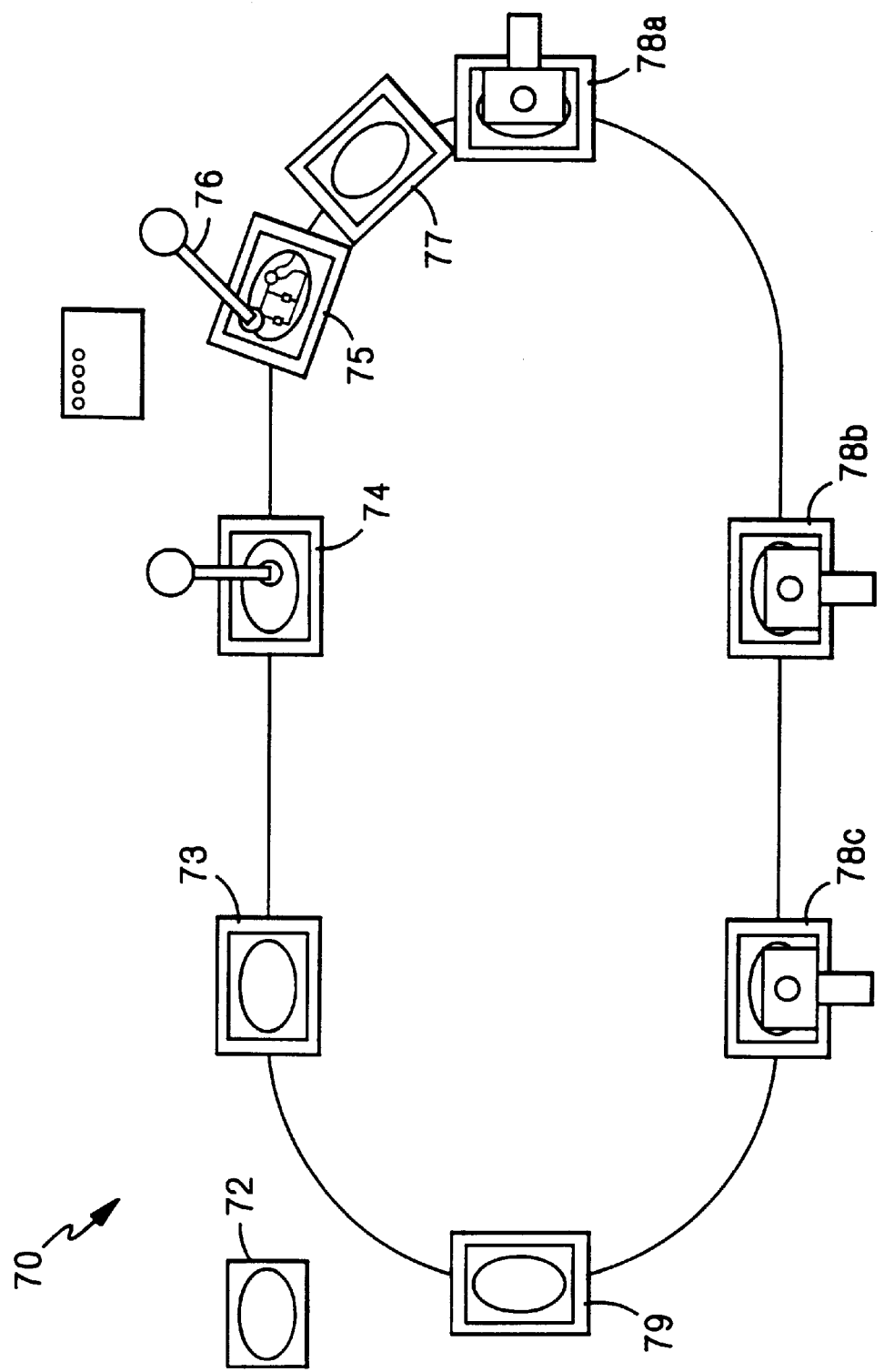
FIG. 7 is a plan view of a surface mounted lamp assembly station.

The process of securing preformed lamps 40 of selected small size to flexible substrate 35 is advantageously adapted for use in an automated production line environment. Referring to FIG. 7, an automated lamp mounting assembly line 70 is supplied an inventory of flexible substrates 35 having predetermined conductive traces 36 and predetermined areas for securing lamps 40. Flexible substrates 35 are conveyed along a line past a series of production stations. At a preparation station 72, for example, substrates 35 are cleaned and prepared for receiving lamps 40 before being conveyed to loading station 73. Each substrate 35 is generally supported on a rigid template to provide support to the flexible substrate as it moves from station to station and to provide registration for the welding procedure. Assembly aides such as adhesive tape 52, 130 (described in conjunction with FIG. 6) or epoxy adhesives are placed at appropriate locations on flexible substrate 35 at an adhesive dispensing station 74. Dispensing station 74 here, includes a syringe that is controlled to dispense a "dot" of quick-drying epoxy, sufficient for supporting a lamp 40, onto an area of the lamp removed from conductive pads 41a.

Lamps 40 are placed on substrates 35 in a "pick and place" fashion at a numerically controlled lamp-mounting station 75 having a robot arm 76. A wide variety of lamps 40 having different sizes, colors, and intensities are supplied from selection trays or from a spool of flexible electroluminescent lamps. A bill of instructions defining the number, type, and position of lamps 40 to be bonded to flexible substrate 35 is provided to assembly line 70 to instruct robot arm 76 to select and properly position lamps 40 on flexible substrate 35.

Finally, completed modular lamp units are conveyed to an unload station 79 where they may be cleaned, inspected, tested and packaged for delivery.

Figure 8:
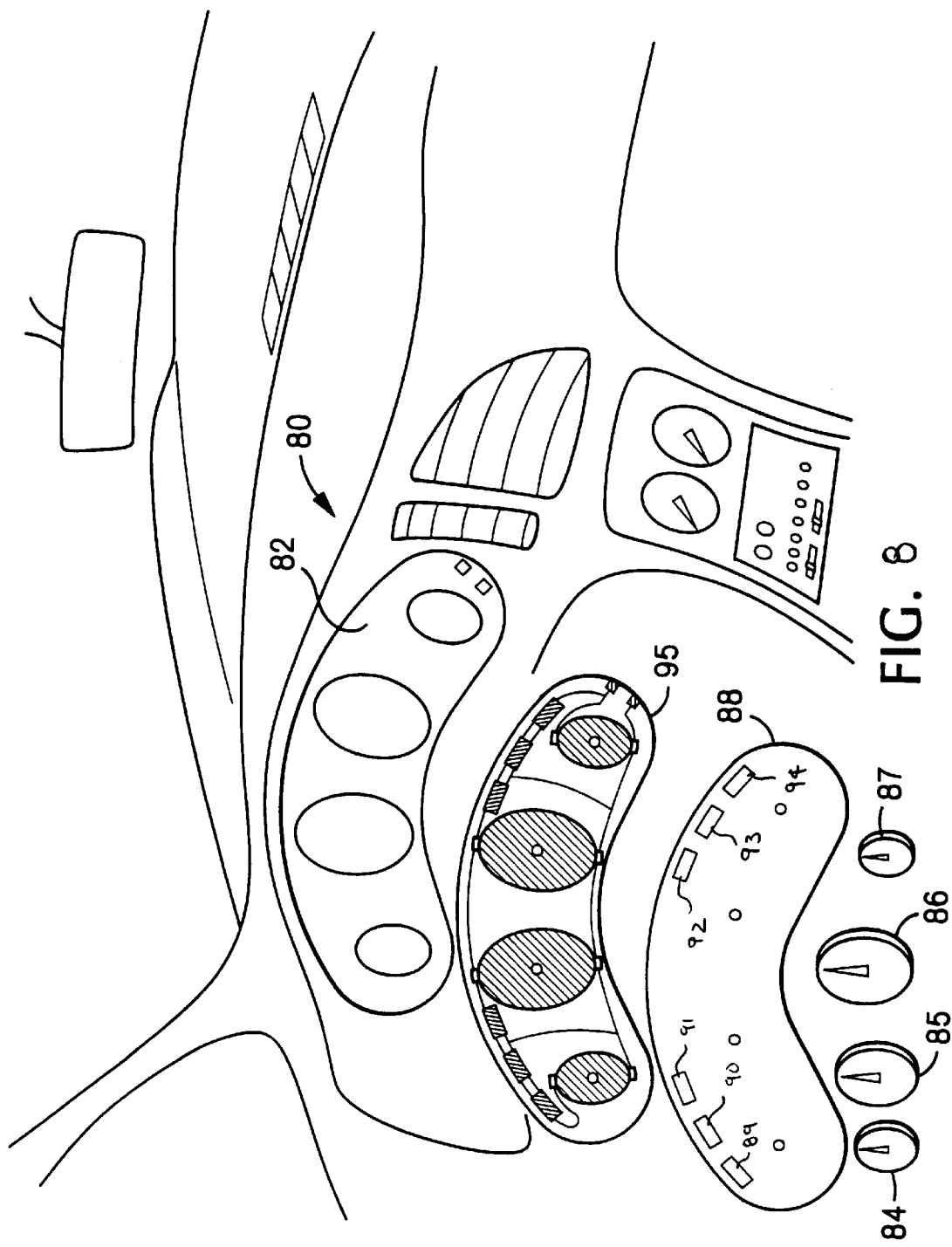
FIG. 8 is another embodiment having surface mounted lamps according to the invention.

Other embodiments are within the scope of the claims. For example, referring to FIG. 8, the interior of an automobile is shown to include an automobile dashboard 80 having an instrumentation mount 82 for supporting a dash panel 88 and gauges 84–87. Instrumentation mount 82 has a concave shape conforming with the curved dashboard of the stylized automobile cockpit. Gauges 84–87 include, for example, speedometer, tachometer, temperature, and fuel gauge functions. Dash panel 88 includes a printed graphic for warning indications 89–94, such as seat belt, open door/trunk, high beam headlight and alternator functions.

Figure 9:
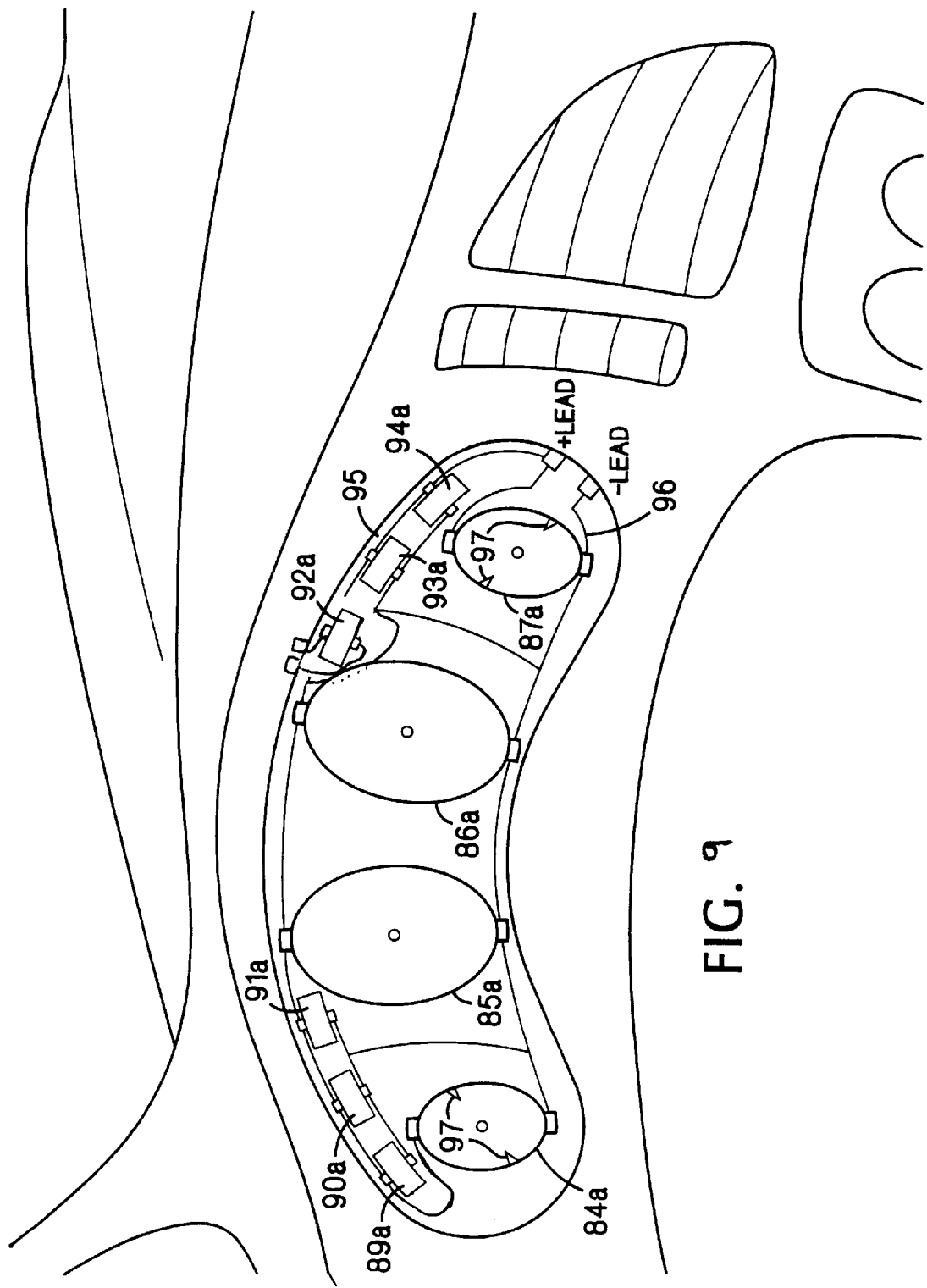
FIG. 9 is an enlarged view of the flexible circuit of FIG. 8.

Referring to FIG. 9, a pre-formed, flexible multi-lamp module unit manufactured in the manner described above is positioned within instrumentation mount 82 and behind both gauges 84–87 and dash panel 88. Flexible circuit 95 of the module is shown carrying electroluminescent lamps 84a–87a and 89a–94a connected with conductive traces 96 of the substrate to an electrical power source (not shown). Electroluminescent lamps 84a–87a and 89a–94a have sizes and shapes conforming with corresponding gauges 84–87 and warning indications 89–94 to be illuminated. Electroluminescent lamps 84a–87a and 89a–94a may be addressable in groups or, where appropriate, independently addressable. For example, electroluminescent lamps 92a is independently addressable and is connected to a switch (not shown) for connecting the lamp to the power source when a particular fault (e.g., seat belt unfastened) is detected. The multi-lamp flexible module may be deformed or flexed to the extent that regions having small radii of curvature exist. In these regions, flexible circuit 95 and attached lamps 84a, 87a may include strain relief incisions 97 to reduce bending stress 40 on lamps 84a, 87a and flexible circuit 95.

In another embodiment, not shown, the multi-lamp flexible module unit shown in FIG. 9 may be formed by employing, as a carrier substrate, a relatively thick self-supporting substrate of thermoplastic which, after manufacture in the flat, is formed by application of pressure and heat with lamps in place into a desired configuration.

In providing lamps for control panels such as the instrumentation mount 82 described above in conjunction with FIG. 9, the flexible substrate manufacturing approach is highly desirable, for being less expensive than forming rigid members. This is true even in the case where the flexible members are eventually joined to a rigid member.

For example, in certain circumstances, flexible electroluminescent lamps have insufficient brightness for applications requiring greater light intensity at localized regions (e.g., warning lights of a control panel cluster). It is within the scope of this invention to apply lamps made by other technologies on the flexible substrate for fulfilling the lighting requirements for these special applications, while presenting on the substrate, flexible electroluminescent lamps to provide back lighting of other features.

Referring again to FIG. 9, for example, electroluminescent lamps 89a–94a, associated with warning indications 89–94 may be in the form of rigid lamps which provide different lighting characteristics than flexible electroluminescent lamps. Substituting rigid lamps for flexible electroluminescent lamps is discussed below in conjunction with the embodiment shown in FIGS. 11A–11C. While not having the characteristic of being flexible, rigid electroluminescent lamps generally provide increased lamp intensity than their flexible counterparts. Moreover, because rigid electroluminescent lamps can be mounted to the substrate using the same surface mount techniques described above, they can be easily substituted for the flexible lamps 89a–94a used within instrumentation mount 82.

Referring to FIGS. 10 and 10A, in another embodiment, the rigid lamps may be in the form of a light emitting diode (LED) lamps 98a–98d. LED lamps offer the advantage of having an increased lamp intensity than a flexible electroluminescent lamp, albeit over a localized, smaller area. Moreover, LED lamps offer the advantage of providing the color red (among other colors) which is often desirable, particularly for warning indicators (e.g., turn signal, seat belt or oil pressure). It is generally difficult to provide the color red using electroluminescent lamps.

Similarly, in still another embodiment, the rigid lamps may be in the form of an incandescent lamp which also provides bright illumination which is "white" in nature at a localized, smaller area. In certain applications, colored lenses, filters or diffusers 103 (FIG. 11A) may be used with incandescent lamps to provide a wide variety of different colors with increased intensity.

In the above embodiments in which the rigid lamps are of the LED or incandescent type, the substrate may include holes to allow the lamps to be crimped into contact with the conductive traces 96. Alternatively, as shown in FIG. 10A, sockets 101 for receiving lamps 89–94 may be positioned within the holes to connect to conductive traces 99.

Figure 11A:
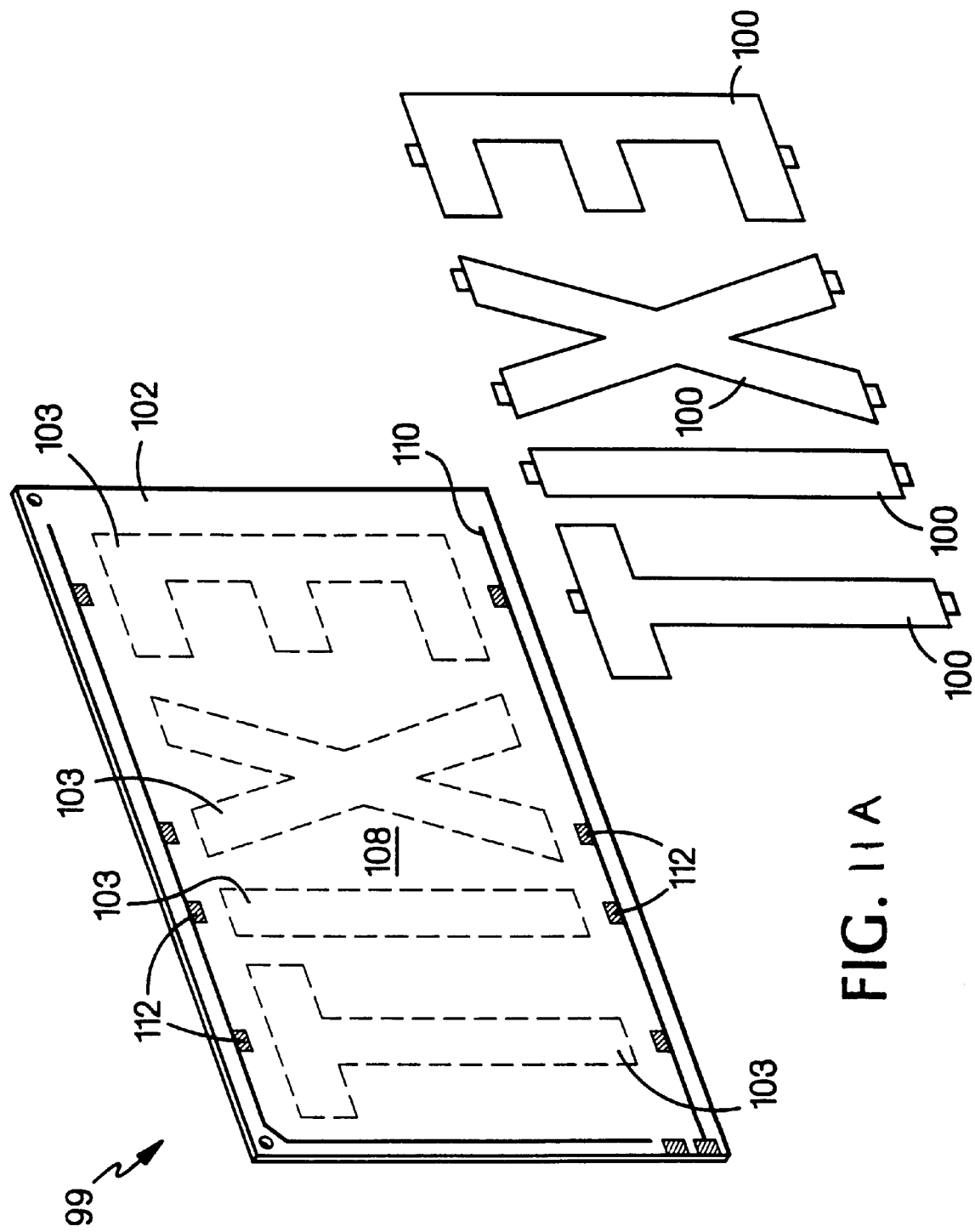
FIG. 11A is an exploded view of a sign having surface mounted lamps according to the invention.
Figure 11B:
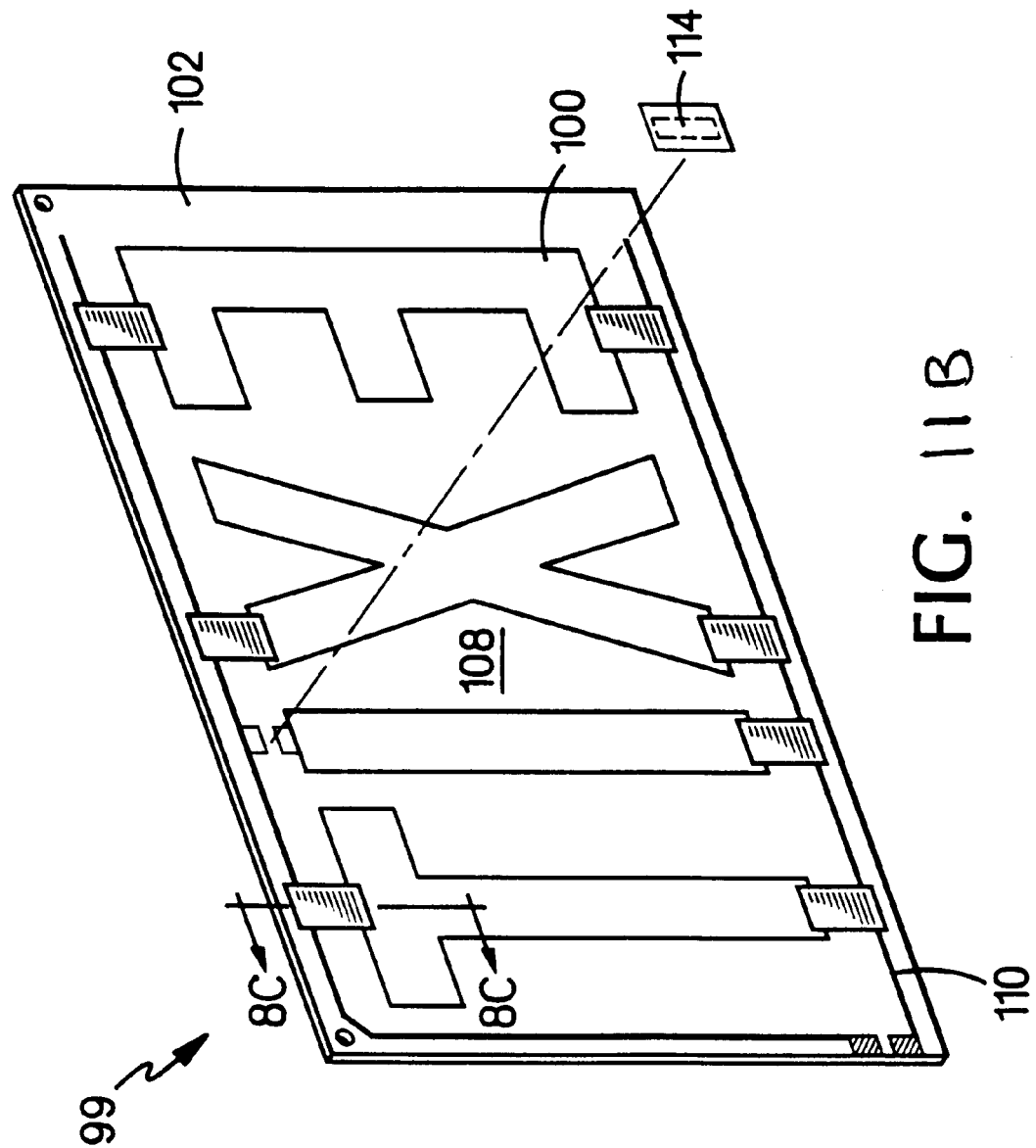
FIG. 11B is an assembled view of the sign of FIG. 11A.
Figure 11C:
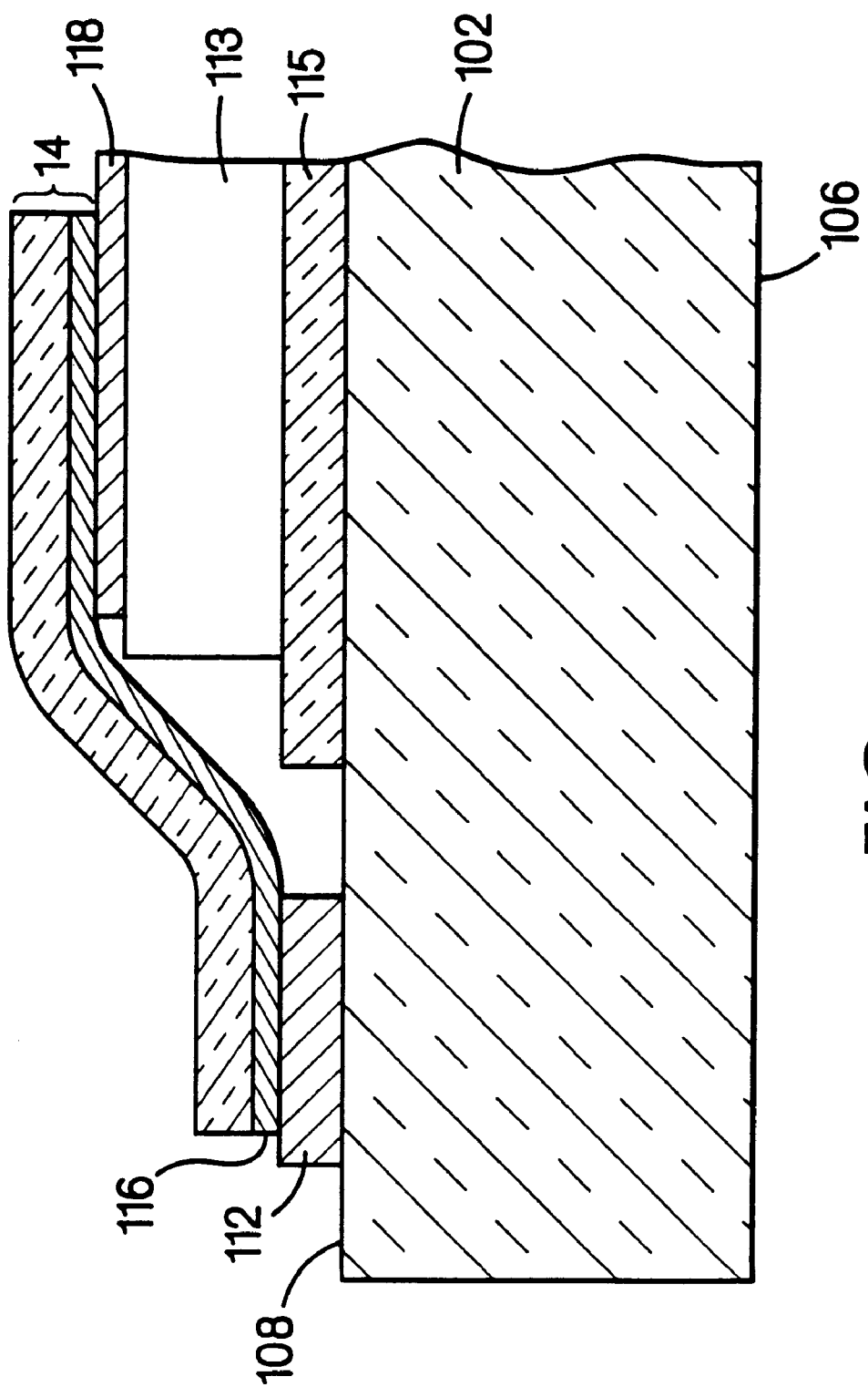
FIG. 11C is a cross-sectional side view of an electroluminescent lamp taken along lines 11C—11C of FIG. 11B.

Referring to FIGS. 11A–11C, electroluminescent lamps 100 are used to light a sign 99. A polycarbonate substrate 102 having a thickness of about 0.020 inches includes a graphic 104 on a front surface 106 with partially transparent areas 103 representing stenciled letters, for example, the word "EXIT". On an opposite rear surface 108 of substrate 102 conductive traces 110 for conveying power to lamps 100 are provided along the outer periphery of substrate 102 having connection pads 112 for attaching lamps 100. Lamps 100 are here fabricated using the process described above in conjunction with FIG. 2. However, because lamps 100 in sign 99 are not required to be flexible, rigid lamps may alternatively be employed, still using surface mount techniques, such as described above. Unlike the embodiments described above in conjunction with FIG. 1, lit sides 113 of lamps 100 are placed face to face with rear surface 108 (ink side) of substrate 102 and held upon substrate 102 using a thin sheet of transparent adhesive 115 (FIG. 11C) so that the emitted light passes through transparent regions 103. Referring to FIGS. 11B and 11C, flexible polyester jumpers 114 having silver traces 116 on one surface are used to connect rear electrodes on unlit sides 118 of lamps 100 to connection pads 112 of substrate 102. Connection between lamps 100 and conductive traces 110 may be accomplished using any of the above described attachment methods described above and in Ser. No. 08/407,269 which is incorporated herein by reference.

What is claimed is:

1. An electroluminescent lamp assembly comprising:
    a substrate having a relatively large lamp receiving surface, having an array of conductive traces disposed on said surface; and
    a plurality of relatively smaller lamps distributed in spaced-apart relationship according to a preselected illumination pattern over, and secured to, said lamp receiving surface, at least one of said lamps comprising:
    a mechanically flexible, multi-layer sheet-form electroluminescent lamp including a sheet-form layer containing electroluminescent particles, said layer disposed between a pair of sheet-form conductive layers, one of which is transparent for transmitting light emitted from said particles, said electroluminescent lamp having conductors exposed for engagement with said conductive traces on said substrate, said electroluminescent lamp being surface mounted face-to-face to said substrate in the manner that its conductors engage selected conductive traces on said lamp receiving surface; and wherein said plurality of relatively smaller lamps further comprises a rigid lamp in the form of a multi-layer sheet-form electroluminescent lamp.

2. The electroluminescent lamp assembly of claim 1 wherein at least one of said multi-layer sheet-form electroluminescent lamp has a first light emitting characteristic different than a second light emitting characteristic of another of said plurality of relatively smaller lamps.

3. The electroluminescent lamp assembly of claim 2 wherein said first light emitting characteristic has a different color from that of said second light emitting characteristic.

4. The electroluminescent lamp assembly of claim 2 wherein said first light emitting characteristic has a different intensity from that of said second light emitting characteristic.

5. The electroluminescent lamp assembly of claim 1 wherein said rigid lamp is of smaller area than said multi-layer sheet-form electroluminescent lamp.

6. The electroluminescent lamp assembly of claim 1 wherein said rigid lamp is surface mounted face-to-face to said substrate.

7. The electroluminescent lamp assembly of claim 1 wherein said rigid lamp is surface mounted face-to-face to said multi-layer sheet-form electroluminescent lamp.

8. The electroluminescent lamp assembly of claim 1 further comprising securing structure to attach the multi-layer sheet-form electroluminescent lamp to said lamp receiving surface of said substrate.

9. The electroluminescent lamp assembly of claim 8 wherein said securing structure includes portions of the substrate that is mechanically deformed.

10. The electroluminescent lamp assembly of claim 8 includes a thermal bond.

11. The electroluminescent lamp assembly of claim 10 wherein said thermal bond comprises an ultrasonic weld.

12. The electroluminescent lamp assembly of claim 8 wherein said securing structure comprises a mechanical fastener.

13. The electroluminescent lamp assembly of claim 8 wherein said securing structure comprises a localized deposit of adhesive at a region of engagement between conductors of said multi-layer sheet-form electroluminescent lamp and selected ones of said conductive traces on said lamp receiving surface of said substrate.

14. The electroluminescent lamp assembly of claim 1 wherein said substrate is a flexible substrate.

15. The electroluminescent lamp assembly of claim 1 wherein said substrate further comprises a second lamp-receiving surface having a second plurality of conductive traces and a second one of said plurality of relatively smaller lamps electrically-connected to said second plurality of conductive traces.

16. The electroluminescent lamp assembly of claim 15 wherein said substrate has a transparent portion through which light from said second one of said plurality of relatively smaller lamps passes to said first-mentioned lamp-receiving surface.

17. The electroluminescent lamp assembly of claim 15 further comprising a light-absorbing filter disposed over said transparent portion.

18. An electroluminescent lamp assembly comprising:

a substrate having a relatively large lamp receiving surface, having an array of conductive traces disposed on said surface;

a plurality of relatively smaller lamps distributed in spaced-apart relationship according to a preselected illumination pattern over, and secured to, said lamp receiving surface, said relatively smaller lamps including:

a mechanically flexible, multi-layer sheet-form electroluminescent lamp including a sheet-form layer containing electroluminescent particles, said layer disposed between a pair of sheet-form conductive layers, one of which is transparent for transmitting light emitted from said particles, said electroluminescent lamp having conductors exposed for engagement with said conductive traces on said substrate, said electroluminescent lamp being surface mounted face-to-face to said substrate in the manner that its conductors engage selected conductive traces on said lamp receiving surface; and a rigid lamp having conductors exposed for engagement with said conductive traces on said substrate, said rigid lamp being surface mounted face-to-face to said substrate in the manner that its conductors engage selected conductive traces on said lamp receiving surface.

19. An electroluminescent lamp assembly comprising:

a substrate having a relatively large lamp receiving surface, having an array of conductive traces disposed on said surface; and a plurality of relatively smaller lamps distributed in spaced-apart relationship according to a preselected illumination pattern over, and secured to, said lamp receiving surface, at least one of said lamps comprising:

a mechanically flexible, multi-layer sheet-form electroluminescent lamp including a sheet-form layer containing electroluminescent particles, said layer disposed between a pair of sheet-form conductive layers, one of which is transparent for transmitting light emitted from said particles, said electroluminescent lamp having conductors exposed for engagement with said conductive traces on said substrate, said electroluminescent lamp being surface mounted face-to-face to said substrate in the manner that its conductors engage selected conductive traces on said lamp receiving surface, wherein said multi-layer sheet-form electroluminescent lamp has a first light emitting characteristic different than a second light emitting characteristic of another of said plurality of relatively smaller lamps.

20. The electroluminescent lamp assembly of claim 19 wherein said first light emitting characteristic has a different color from that of said second light emitting characteristic.

21. The electroluminescent lamp assembly of claim 19 wherein said first light emitting characteristic has a different intensity from that of said second light emitting characteristic.

22. The electroluminescent lamp assembly of claim 19 further comprising securing structure to attach the multi-layer sheet-form electroluminescent lamp to said lamp receiving surface of said substrate.

23. The electroluminescent lamp assembly of claim 22 wherein said securing structure includes portions of the substrate that is mechanically deformed.

24. The electroluminescent lamp assembly of claim 22 includes a thermal bond.

25. The electroluminescent lamp assembly of claim 24 wherein said thermal bond comprises an ultrasonic weld.

26. The electroluminescent lamp assembly of claim 22 wherein said securing structure comprises a mechanical fastener.

27. The electroluminescent lamp assembly of claim 22 wherein said securing structure comprises a localized deposit of adhesive at a region of engagement between conductors of said multi-layer sheet-form electroluminescent lamp and selected ones of said conductive traces on said lamp receiving surface of said substrate.

28. The electroluminescent lamp assembly of claim 19 wherein said substrate is a flexible substrate.

29. The electroluminescent lamp assembly of claim 19 wherein said substrate further comprises a second lamp-receiving surface having a second plurality of conductive traces and a second one of said plurality of relatively smaller lamps electrically-connected to said second plurality of conductive traces.

30. The electroluminescent lamp assembly of claim 29 wherein said substrate has a transparent portion through which light from said second one of said plurality of relatively smaller lamps passes to said first-mentioned lamp-receiving surface.

31. The electroluminescent lamp assembly of claim 29 further comprising a light-absorbing filter disposed over said transparent portion.

* * * * *